US005390255A

United States Patent [19]

Popovich

[11] Patent Number: 5,390,255

[45] Date of Patent: Feb. 14, 1995

[54] ACTIVE ACOUSTIC ATTENUATION SYSTEM WITH ERROR AND MODEL COPY INPUT

[75] Inventor: Steven R. Popovich, Stoughton, Wis.

[73] Assignee: Nelson Industries, Inc., Stoughton, Wis.

[21] Appl. No.: 175,688

[22] Filed: Dec. 30, 1993

Related U.S. Application Data

[63] Continuation of Ser. No. 953,129, Sep. 29, 1992, abandoned.

[51] Int. Cl.$^6$ .............................................. H03B 29/00
[52] U.S. Cl. ......................................... 381/71; 381/94
[58] Field of Search .................................... 381/71, 94

[56] References Cited

U.S. PATENT DOCUMENTS

| | | |
|---|---|---|
| 2,983,790 | 5/1961 | Olson . |
| 4,677,676 | 6/1987 | Eriksson . |
| 4,677,677 | 6/1987 | Eriksson . |
| 4,736,431 | 4/1988 | Allie et al. . |
| 4,815,139 | 3/1989 | Eriksson et al. . |
| 4,837,834 | 6/1989 | Allie . |
| 4,987,598 | 1/1991 | Eriksson . |
| 5,022,082 | 6/1991 | Eriksson et al. . |
| 5,033,082 | 7/1991 | Eriksson et al. . |
| 5,105,377 | 4/1992 | Ziegler, Jr. . |

OTHER PUBLICATIONS

Dorf, Richard C., *Modern Control Systems,* Addison-Wesley, Jan., 1992.

"Active Adaptive Sound Countrol in a Duct: A Computer Simulation", J. C. Burgess, Journal of Acoustic Society of America, 70(3), Sep., 1981, pp. 715–726.

"Number Theory in Science and Communications", M. R. Schroeder, Berlin, Springer-Berlag, 1984, pp. 252–261.

"Echo Cancellation Algorithms" Gritton and Lin, IEEE ASST Magazine, Apr. 1984, pp. 30–38.

"Development of the Filter-U Algorithm for Active Noise Control", L. Eriksson, Journal of Acoutic Society of America, 89(1), Jan., 1991, pp. 257–265.

"Recursive Algorithms for Active Noise Control", International Symposium on Active Control of Sound and Vibration, Tokyo, Japan, Apr. 9–11, 1991, pp. 137–146.

*Primary Examiner*—Curtis Kuntz
*Assistant Examiner*—Mark D. Kelly
*Attorney, Agent, or Firm*—Andrus, Sceales, Starke & Sawall

[57] ABSTRACT

An active acoustic attenuation system attenuates a correlated input acoustic wave and eliminates the need for an input transducer sensing such wave and also eliminates the need to sum a filtered modification of the model output correction signal with the error signal as an input to the model. The error signal is instead summed with the model input signal provided through a model copy, and the output resultant sum is supplied as the input to the model. A summer sums the error signal from the error transducer and the output of a copy of the adaptive filter model and supplies the resultant sum to the model input. Another copy of a model modeling the output transducer and the error path between the output transducer and the error transducer is connected in series between the model input and the input of the first noted model copy.

1 Claim, 4 Drawing Sheets

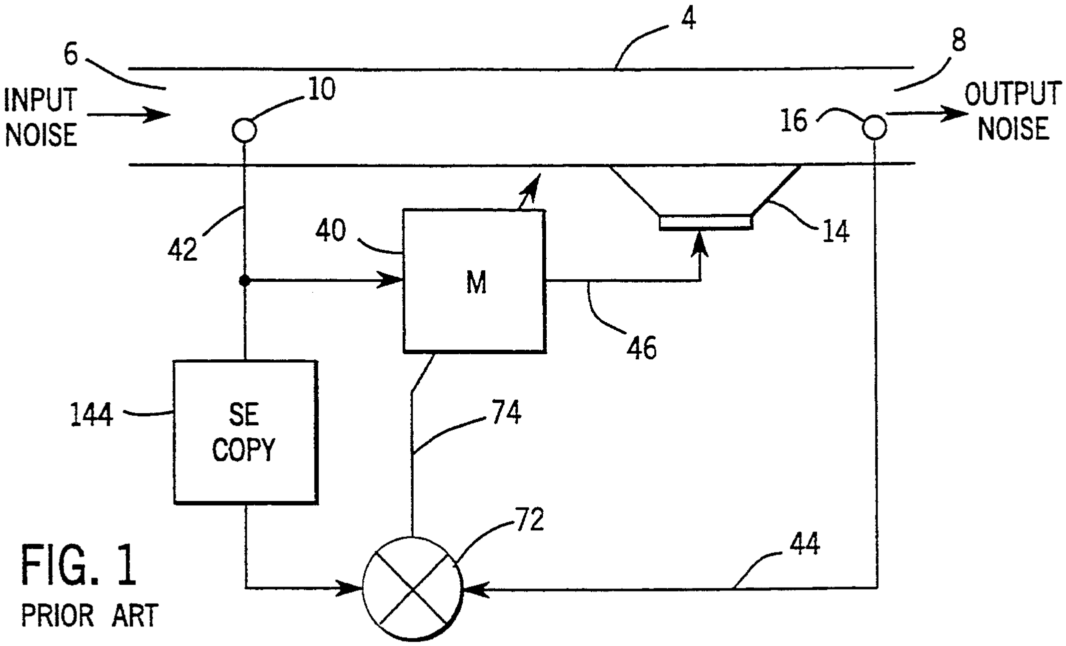
FIG. 1
PRIOR ART
FIG. 2
PRIOR ART
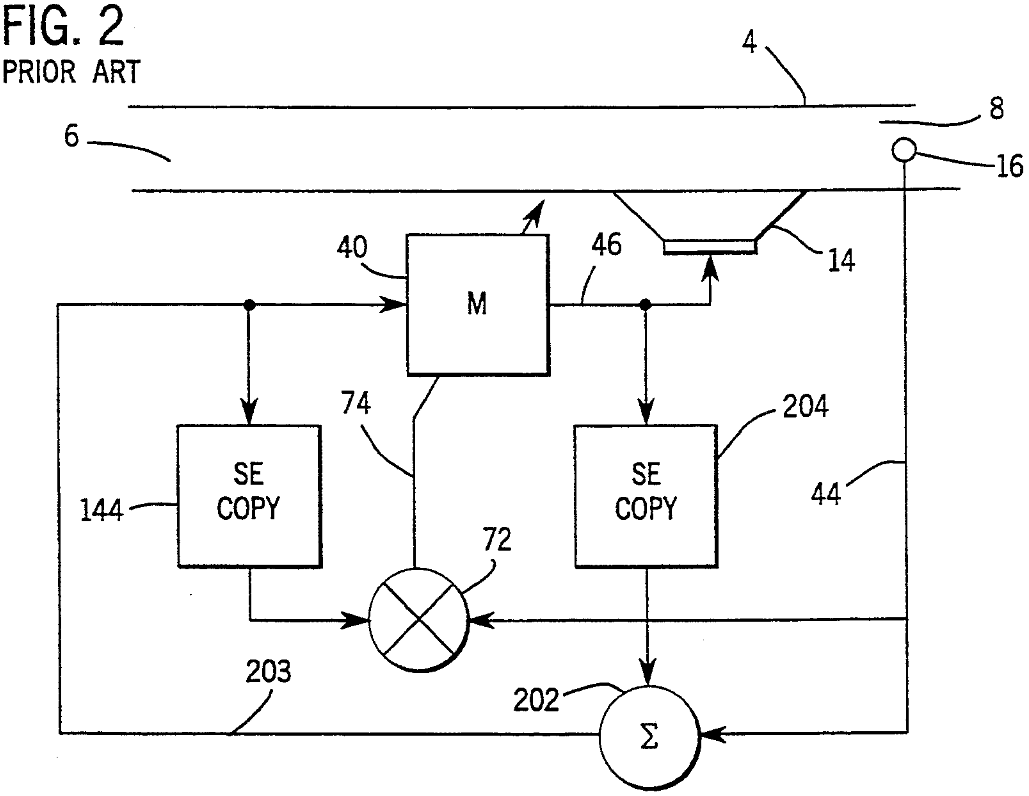

ACTIVE ACOUSTIC ATTENUATION SYSTEM WITH ERROR AND MODEL COPY INPUT

The present application is a continuation application of U.S. patent application Ser. No. 07/953,129, filed Sep. 29, 1992, now abandoned.

BACKGROUND AND SUMMARY

The invention relates to active acoustic attenuation systems, and more particularly to a system for a correlated input acoustic wave, i.e. periodic, band limited, or otherwise having some predictability.

The invention arose during continuing development efforts directed toward the subject matter shown and described in U.S. Pat. Nos. 4,677,676, 4,677,677, 4,736,431, 4,815,139, 4,837,834, 4,987,598, 5,022,082, and 5,033,082, incorporated herein by reference.

Active acoustic attenuation involves injecting a canceling acoustic wave to destructively interfere with and cancel an input acoustic wave. In an active acoustic attenuation system, the output acoustic wave is sensed with an error transducer, such as a microphone or an accelerometer, which supplies an error signal to an adaptive filter control model which in turn supplies a correction signal to a canceling output transducer, such as a loudspeaker or a shaker, which injects an acoustic wave to destructively interfere with the input acoustic wave and cancel same such that the output acoustic wave at the error transducer is zero or some other desired value.

The present invention provides an active acoustic attenuation system .for attenuating correlated acoustic fields, including sound and vibration, and eliminates the need for an input transducer, such as an input microphone or an accelerometer sensing the input acoustic wave. It is known in the prior art that the input signal may be provided by one or more error signals, in the case of a periodic noise source, "Active Adaptive Sound Control In A Duct: A Computer Simulation", J. C. Burgess, Journal of Acoustic Society of America, 70(3), September 1981, pages 715–726. It is known in the prior art to sum the error signal with the model output correction signal, and to supply the resultant sum as the model input. The present invention eliminates the need to use the model output correction signal in the sum supplied to the model input.

In the prior art, the input signal is processed through the model M and then through a speaker-error path SE copy, and then is summed with the error signal to provide the noted resultant sum supplied as the model input. The present invention recognizes that, for purposes of summing with the error signal, the processing of the input signal through M and then through SE copy may be reversed. In the present invention, the input signal is processed through the model M in normal manner. The input signal is also processed in a parallel path initially through an SE copy and then through a model M copy, and then is summed with the error signal to provide a resultant sum which is supplied as the model input. In the present invention, SE copy and M copy are in series between the model input and the error signal summer, and the input signal is processed first through SE copy and then through M copy. This is in contrast to the prior art wherein M and SE copy are in series between the model input and the error signal summer, and the input signal is processed first through M and then through SE copy for summing with the error signal.

BRIEF DESCRIPTION OF THE DRAWINGS

FIG. 1 is a schematic illustration of an active acoustic attenuation system known in the prior art.

FIG. 2 shows another system known in the prior art.

DETAILED DESCRIPTION

Prior Art

Figure 5:
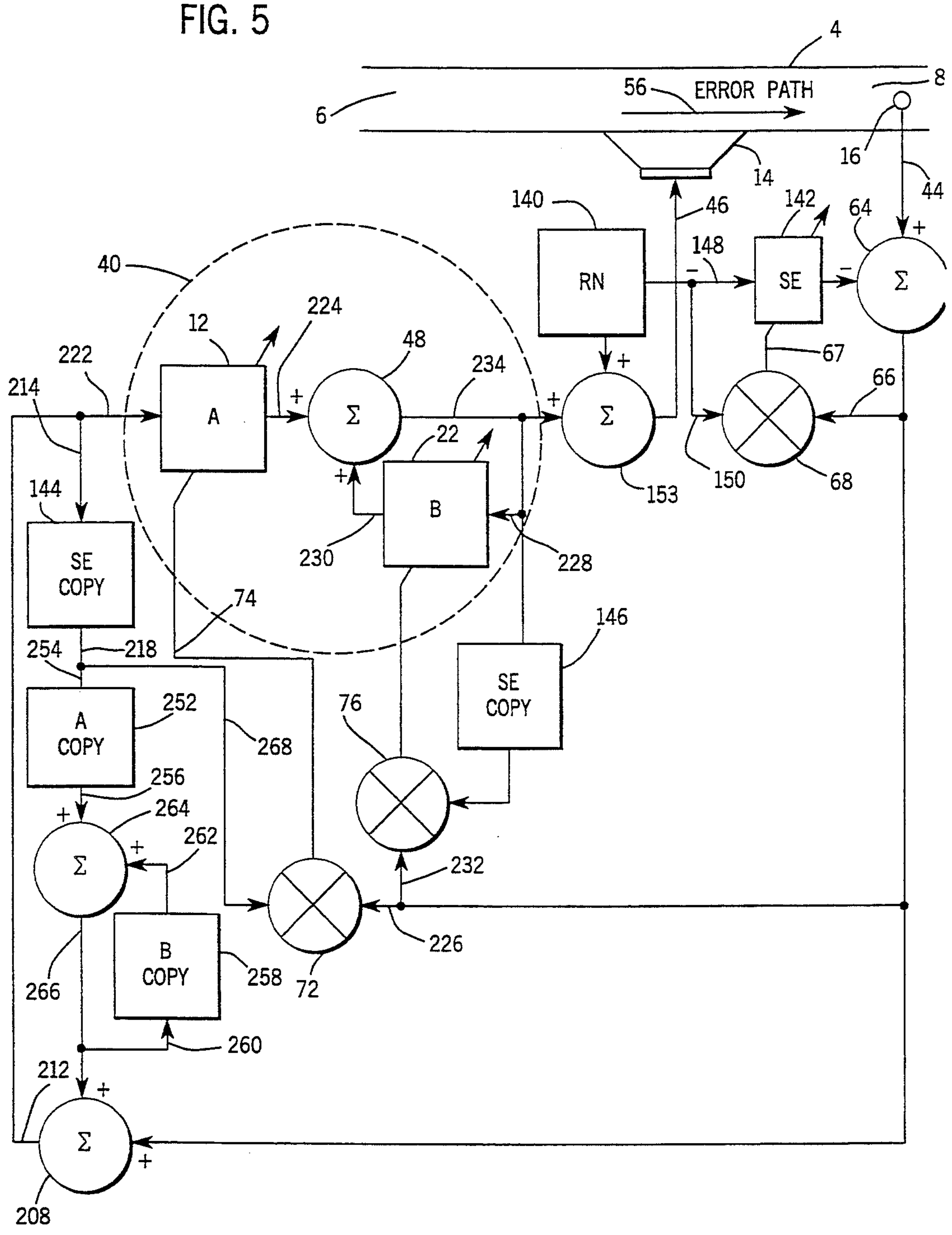
FIG. 5 shows a further embodiment of the invention.

FIG. 1 is similar to FIG. 5 of incorporated U.S. Pat. No. 4,677,676, and uses like reference numerals to facilitate understanding. The acoustic system of FIG. 1 includes a propagation path or environment such as within or defined by a duct or plant 4. The system has an input 6 for receiving an input acoustic wave, e.g. input noise, and an output 8 for radiating or outputting an output acoustic wave, e.g. output noise. An input transducer such as an input microphone 10 senses the input acoustic wave. An output transducer such as canceling loudspeaker 14 introduces a canceling acoustic wave to attenuate the input acoustic wave and yield an attenuated output acoustic wave. An error transducer such as an error microphone 16 senses the output acoustic wave and provides an error signal at 44. Adaptive filter model M at 40 adaptively models the acoustic path from input transducer 10 to output transducer 14. Model M has a model input 42 from input transducer 10, an error input 44 from error transducer 16, and a model output 46 outputting a correction signal to output transducer 14 to introduce the canceling acoustic wave. The error signal at 44 is typically multiplied with the input signal at 42 by multiplier 72, and the resultant product provided as a weight update signal 74, for example as discussed in Gritton and Lin "Echo Cancellation Algorithms", IEEE ASSP Magazine, April 1984, page 30–38. In some prior art references, multiplier 72 is explicitly shown, and in others the multiplier 72 or other combination of signals 42 and 44 is inherent or implied in controller 40 and hence multiplier or combiner 72 may be deleted in various references, and such is noted for clarity. For example, FIG. 5 of the incorporated '676 patent shows the deletion of such multiplier or combiner 72; and such function, if necessary, may be implied in controller 40, as understood in the art. It is known in the prior art to model speaker 14 and the error path between speaker 14 and error transducer 16 with an adaptive filter model as shown at 142 in FIG. 19 of the incorporated '676 patent, and to provide a copy 144 of such model in the input to multiplier 72, to provide compensation for the speaker and error path.

Figure 4:
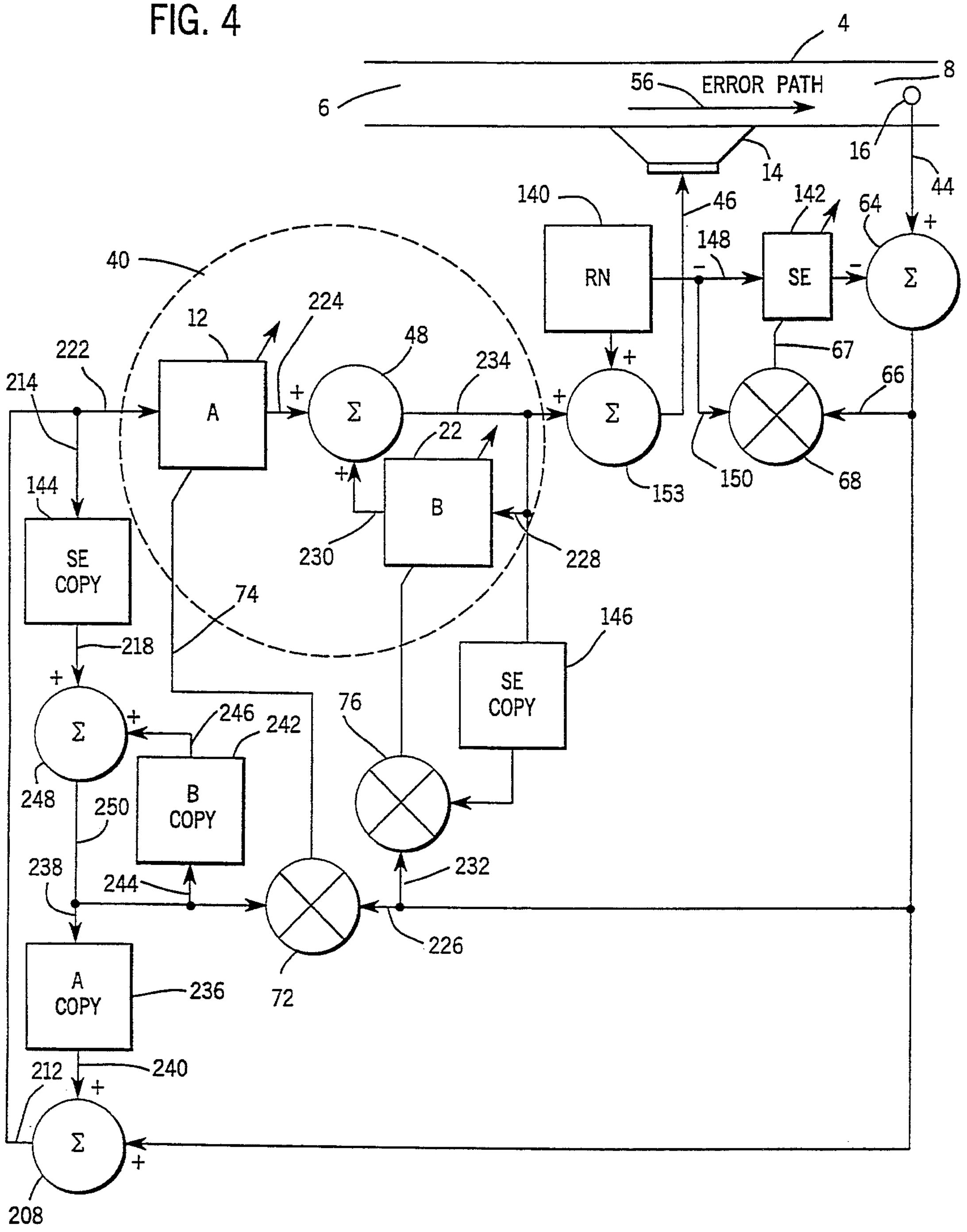
FIG. 4 shows a further embodiment of the invention.

As noted in the incorporated '676 patent, and as shown in FIG. 4 herein, model M is an adaptive recursive filter having a transfer function with both poles and zeros. Model M is provided by a recursive least mean square, RLMS, filter having a first algorithm filter provided by least mean square, LMS, filter A at 12, and a second algorithm filter provided by LMS filter B at 22. Adaptive model M uses filters A and B to adaptively model both the acoustic path from input transducer 10 to output transducer 14 and the feedback path from output transducer 14 to input transducer 10. Filter A provides the direct transfer function, and filter B provides a recursive transfer function. The outputs of filters A and B are summed at summer 48, whose output provides the correction signal at 46.

As noted in the incorporated '676 patent, column 10, line 18+, it is desirable to use the noise in the duct immediately upstream of speaker 14 as the input to filter B. This is because the correction signal at 46 tends to become equal to such noise as the model adapts and converges. By using the noise in the duct as the input to filter B instead of correction signal 46, the proper input to filter B is provided immediately, rather than waiting for convergence of the model. Thus, improved performance is possible from the beginning of operation. However, it is difficult to measure the noise without interaction of the canceling sound from speaker 14. FIGS. 9 and 11 of the incorporated '676 patent shows a desirable implementation enabling the desired modeling without the noted measurement problem. In FIGS. 9 and 11 of the incorporated '676 patent, the error signal at 44 is summed at summer 52 with the correction signal at 46, and the result is provided as the filter input 54 to filter B. Input 54 is equal to the noise in the duct at 50 in FIG. 8 of the incorporated '676 patent, however it has been obtained without the impractical acoustical measurement required in FIG. 8 of the '676 patent. The noise in the duct approaching speaker 14 is subtractively summed (summer 18 in FIGS. 8, 9 and 11 of the incorporated '676 patent) with the correction signal 46 and is sensed by microphone 16 to yield error signal 44 which is then additively summed with correction signal 46 at summer 52, to yield at output 54 the noted noise in the duct. The implementation shown in FIGS. 9 and 11 of the '676 patent is called the equation error form, and is also described and shown in FIG. 4 of "Recursive Algorithms For Active Noise Control", L. Eriksson, International Symposium on Active Control of Sound and Vibration, Tokyo, Japan, Apr. 9–11, 1991, pages 137–146.

As noted in the '676 patent, no input microphone is necessary, and instead the input signal may be provided by a transducer such as a tachometer which provides the frequency of a periodic input acoustic wave. Further alternatively, the input signal may be provided by one or more error signals, in the case of a periodic noise source, "Active Adaptive Sound Control In A Duct: A Computer Simulation" J. C. Burgess, Journal of Acoustic Society of America, 70(3), September 1981, pages 715–726. Feedback control with a single microphone is also known in the art, U.S. Pat. No. 2,983,790.

It is known in the prior art to sum error signal 44 at summer 202, FIG. 2 herein, with model output correction signal 46 filtered through another copy 204 of the model modeling speaker 14 and the error path between speaker 14 and error microphone 16, and to provide the output resultant sum 203 from summer 202 as the input to model 40, eliminating input microphone 10.

Present Invention

Figure 3:
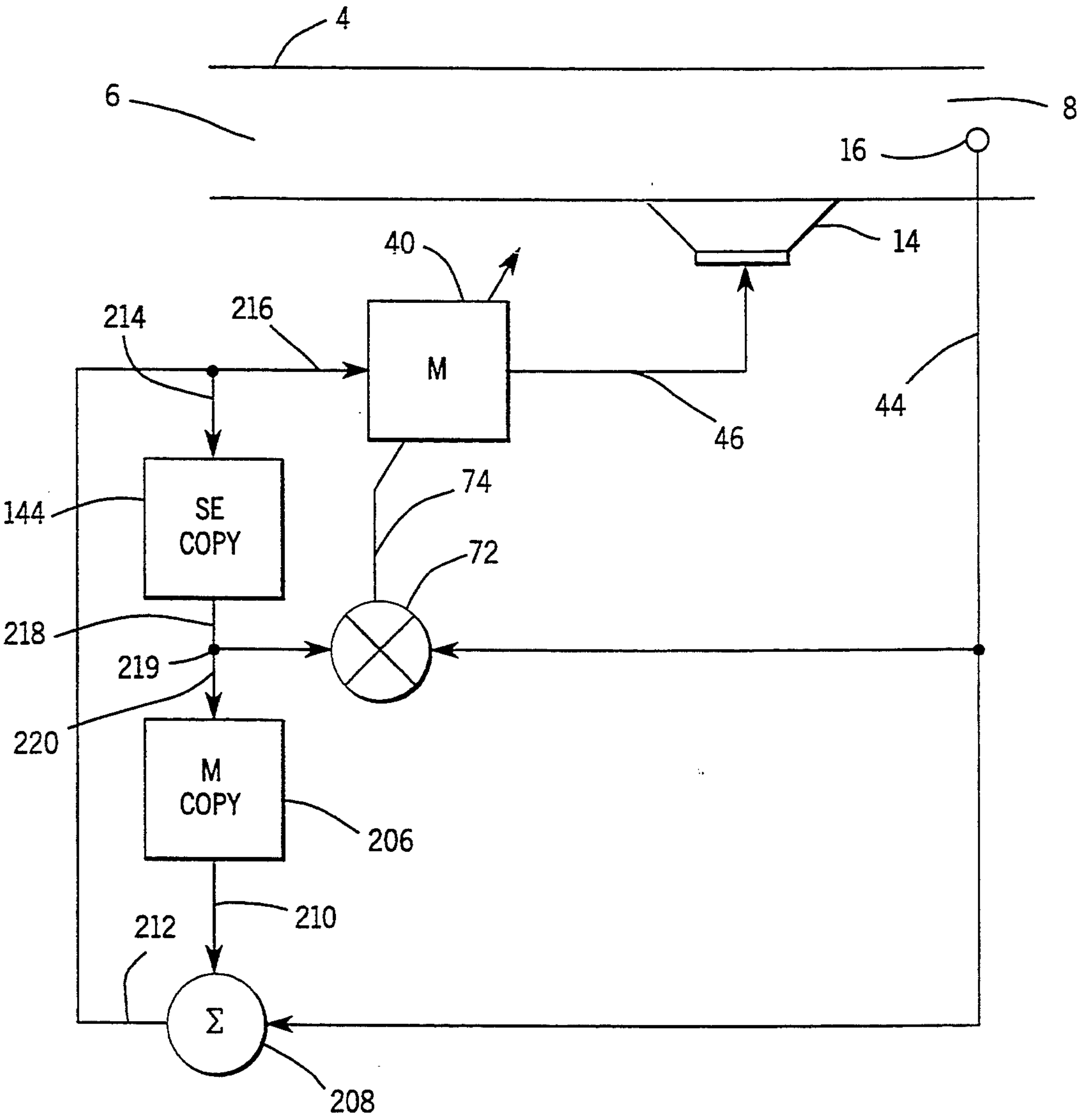
FIG. 3 is a schematic illustration of an active acoustic attenuation system in accordance with the present invention.

The present invention is shown in FIG. 3 and provides an improvement over the system shown in FIG. 2. FIG. 3 uses like reference numerals from FIGS. 1 and 2 and from the incorporated '676 patent, where appropriate to facilitate understanding. In FIG. 3, a copy of model 40 is provided at 206. Summer 208 sums the error signal 44 from error transducer 16 and the output 210 of model copy 206 and supplies the resultant sum 212 to the input 214 of model copy 144 and to the input 216 of adaptive filter model 40. The output 218 of model copy 144 is supplied to multiplier 72 as in FIG. 2, and is also supplied to input 220 of model copy 206. Model copies 206 and 144 are connected in series between model input 216 and summer 208. Multiplier 72 has a first input from node 219 between model copies 144 and 206, and a second input from the error signal from error transducer 16, and supplies the resultant product as weight update signal 74 to adaptive filter model 40. The system of FIG. 3 eliminates the need to use the model output correction signal 46 in the sum 212 supplied to the model input, in contrast to FIG. 2.

In the prior art as shown in FIG. 2, the input signal is processed through model M 40 and then through SE copy 204, and then is summed with the error signal at summer 202 to provide resultant sum 203 supplied as the model input. The present invention recognizes that, for purposes of summing with the error signal, the processing of the input signal through M and then through SE copy may be reversed. In the present invention as shown in FIG. 3, the input signal is processed through model M 40 in normal manner. The input signal is also processed in a parallel path initially through SE copy 144 and then through model M copy 206, and then is summed with the error signal at summer 208 to provide resultant sum 212 which is supplied as the model input. In the present invention as shown in FIG. 3, SE copy and M copy are in series between the model input 216 and the error signal summer 208, and the input signal is processed first through SE copy and then through M copy. This is in contrast to the prior art as shown in FIG. 2 wherein M and SE copy are in series between the model input and the error signal summer 202, and the input signal is processed first through M and then through SE copy for summing with the error signal.

Model M may be a FIR, finite impulse response, filter such as an LMS, least mean square, algorithm filter, or an IIR, infinite impulse response, filter, such as a RLMS, recursive least mean square, algorithm filter, as in the incorporated '676 patent.

FIG. 4 shows recursive model structure, and uses like reference numerals from FIGS. 1–3 and from the incorporated '676 patent, particularly FIG. 19. Algorithm filter A at 12 has a filter input 222 from summer 208, a filter output 224, and an error input 226 through multiplier 72 receiving the error signal from error transducer 16. Algorithm filter B at 22 has a filter input 228 from the model output correction signal, a filter output 230, and an error input 232 supplied through multiplier 76 and receiving the error signal from error transducer 16. Summer 48 has a first input from filter A output 224, a second input from filter B output 230, and an output 234 outputting a resultant sum as the correction signal to output transducer 14. It is preferred that each filter A and B be a least mean square algorithm filter, to thus provide a recursive least mean square filter model.

It is preferred that the system include a speaker and error path model modeling output transducer 14 and the error path between output transducer 14 and error transducer 16, as in FIGS. 19 and 20 of the incorporated '676 patent. The speaker and error path model SE is preferably provided using a random noise source 140. A copy of the SE model is provided at 144 and 146, as in the incorporated '676 patent. Alternatively, the speaker and/or error path may be modeled without a random noise source as in incorporated U.S. Pat. No. 4,987,598. It is preferred that the speaker and error path modeling include modeling of the transfer function of both speaker 14 and the acoustic path 56 from such speaker to error microphone 16, though the SE model may include only one of such transfer functions, for example if the other transfer function is relatively constant, or may include other transfer functions after model M.

Auxiliary noise source 140 introduces auxiliary noise such that error transducer 16 also senses the auxiliary noise from the auxiliary noise source. The auxiliary noise may be introduced into the recursive loop of the A and B filters as in FIG. 19 of the incorporated '676 patent at summer 152, or alternatively the auxiliary noise may be introduced into the model at summer 153 after the recursive loop. The auxiliary noise source is random and uncorrelated to the input noise at 6, and in preferred form is provided by a Galois sequence, M. R. Schroeder, "Number Theory in Science and Communications", Berlin, Springer-Berlag, 1984, pages 252–261, though other random uncorrelated noise sources may of course be used. The Galois sequence is a pseudo random sequence that repeats after $2^{M}$-1 points, where M is the number of stages in a shift register. The Galois sequence is preferred because it is easy to calculate and can easily have a period much longer than the response time of the system.

Model 142 models both the error path E at 56 and the speaker or output transducer S at 14 on-line. Model 142 is an adaptive filter model provided by an LMS filter. A copy of the SE model is provided at 144 and 146 in model 40 to compensate for speaker 14 and error path 56. Adaptive filter model 142 has a model input 148 from auxiliary noise source 140. The error signal output 44 of error path 56 at output microphone 16 is summed at summer 64 with the output of model 142 and the result is used as an error input to model 142. The sum at 66 is multiplied at multiplier 68 with the auxiliary noise at 150 from auxiliary noise source 140, and the result is used as a weight update signal at 67 to model 142. The outputs of the auxiliary noise source 140 and summer 48 are summed at summer 153 and the result is used as the correction signal at 46 to output transducer 14. Adaptive filter model 40, as noted above, is provided by first and second algorithm filters A and B at 12 and 22 each having an error input from error microphone 16. The outputs of algorithm filters A and B are summed at summer 48 and the resulting sum is summed at summer 153 with the auxiliary noise from auxiliary noise source 140 and the resulting sum is used as the correction signal at 46 to output transducer 14. The output of error transducer 16 at 44 may be provided directly to multipliers 72 and 76 as in FIG. 19 of the incorporated '676 patent, and may be supplied directly to summer 208, or alternatively the error signal may be provided through summer 64 to multipliers 72 and 76 and to summer 208 as shown in FIG. 4 herein.

A copy of the A filter 12 is provided at 236 and has an input 238 and an output 240. A copy of the B filter 22 is provided at 242 and has an input 244 and an output 246. Summer 208 sums the error signal from error transducer 16 and the output 240.of A model copy 236, and provides an output resultant sum at 212 supplied to input 222 of filter 12 and to input 214 of SE copy 144. Summer 248 sums the output 218 of SE copy 144 and the output 246 of model copy 242 and provides an output resultant sum 250 supplied to input 238 of model copy 236 and to input. 244 of model copy 242 and to the error input of the A filter 12 at multiplier 72.

FIG. 5 is similar to FIG. 4 and uses like reference numerals where appropriate to facilitate understanding, and shows a preferred embodiment. A copy of the A filter 12 is provided at 252 and has an input 254 and an output 256. A copy of the B filter 22 is provided at 258 and has an input 260 and an output 262. Summer 264 sums the output 256 of A model copy 252 and the output 262 of B model copy 258, and supplies an output resultant sum at 266 to input 260 of B model copy 258. Summer 208 sums the error signal from error transducer 16 and resultant sum 266 and supplies an output resultant sum at 212 to input 222 of A filter 12. As in FIG. 4, model 142 models output transducer 14 and the error path 56 between output transducer 14 and error transducer 16, and a copy of model 142 is provided at 144 and 146. SE model copy 144, FIG. 5, has an input at 214 from the noted resultant sum at 212, and has an output at 218 supplied to input 254 of A model copy 252, and also supplied at 268 to the error input of A filter 12.

It is recognized that various equivalents, alternatives and modifications are possible within the scope of the appended claims.

I claim:

1. An active acoustic attenuation system for attenuating an input acoustic wave comprising:

an output transducer introducing a canceling acoustic wave to attenuate the input acoustic wave and yield an attenuated output acoustic wave;

an error transducer sensing the output acoustic wave and providing an error signal;

a first adaptive filter model modeling the acoustic system and outputting a correction signal to the output transducer to introduce the canceling acoustic wave, the first adaptive filter model comprising:

a first algorithm filter comprising an A filter having a filter input, a filter output, and an error input from the error transducer;

a second algorithm filter comprising a B filter having a filter input from the correction signal, a filter output, and an error input from the error transducer; and a first summer having a first input from the filter output of the A filter, a second input from the filter output of the B filter, and an output outputting a first resultant sum as the correction signal;

a first model copy comprising a copy of the A filter and having an input and an output;

a second model copy comprising a copy of the B filter and having an input and an output;

a third model copy comprising a copy of a model modeling the output transducer and the error path between the output transducer and the error transducer and having an input and a output;

a second summer summing the error signal and the output of the first model copy, and supplying a second resultant sum to the filter input of the A filter and to the input of the third model copy; and a third summer summing the output of the third model copy and the output of the second model copy, and supplying a third resultant sum to the input of the first model copy and to the input of the second model copy and to the error input of the A filter for modifying the error input from the error transducer.

* * * * *